United States Patent [19]
Fraas et al.

[11] Patent Number: 6,057,507
[45] Date of Patent: May 2, 2000

[54] COARSE GRAIN POLYCRYSTALLINE GALLIUM ANTIMONIDE THERMOPHOTOVOLTAIC CELL

[75] Inventors: Lewis M. Fraas; Han-Xiang Huang, both of Issaquah, Wash.

[73] Assignee: JX Crystals Inc., Issaquah, Wash.

[21] Appl. No.: 09/388,356

[22] Filed: Sep. 1, 1999

Related U.S. Application Data

[60] Provisional application No. 60/099,679, Sep. 10, 1998.

[51] Int. Cl.$^7$ ..................................................... H01L 31/00
[52] U.S. Cl. ......................... 136/253; 136/262; 136/264; 136/265
[58] Field of Search .................................... 136/253, 262, 136/264, 265

[56] References Cited

U.S. PATENT DOCUMENTS

| | | | |
|---|---|---|---|
| 4,234,352 | 11/1980 | Swanson | 136/253 |
| 5,091,018 | 2/1992 | Fraas et al. | 136/246 |
| 5,096,505 | 3/1992 | Fraas et al. | 136/246 |
| 5,118,361 | 6/1992 | Fraas et al. | 136/246 |
| 5,123,968 | 6/1992 | Fraas et al. | 136/246 |
| 5,217,539 | 6/1993 | Fraas et al. | 136/246 |
| 5,248,346 | 9/1993 | Fraas et al. | 136/244 |
| 5,389,158 | 2/1995 | Fraas et al. | 136/244 |

OTHER PUBLICATIONS

Fraas, Lewis et al., "Status of TPV Commercial System Development Using GaSb Infrared Sensitive Cells," Paper presented at Second World Photovoltaic Specialists Conference, Vienna, Austria, Jul. 6–10, 1998.

Morgan, M.D. et al., "Radioisotope Thermal Photovoltaic Application of the GaSb Solar Cell," NASA SPRAT Conference, pp. 349–358, (U.S.A. 1989).

A.C. Day, W.E.Horne and M.D. Morgan, "Application of the GaSb Solar Cell in Isotope–Heated Power Systems," Conference Record of the 21st IEEE Photovoltaic Specialists Conference, Kissimmee, Fl., May 1990, pp. 1320–1325.

Whitaker, T., "GaSb Shines Brighter Than The Midnight Sun," Compound Semiconductor, Fall I, 1998, pp. 33–34.

*Primary Examiner*—Mark Chapman
*Attorney, Agent, or Firm*—James Creighton Wray; Meera P. Narasimhan

[57] ABSTRACT

A TPV cell apparatus with a base region of GaSb crystals. The GaSb crystals are of varying orientations and joined at grain boundaries. A surface region is provided on the GaSb crystals. The GaSb crystals are Tellurium doped N-type GaSb and the surface region is thin Zinc doped P-type GaSb cells. The surface region faces an infrared source. A bus region is connected to a metal grid connected which is in contact with the surface region of the cell. A continuous metal layer is in contact with the GaSb crystals. A multilayer coating is provided on a front side of the cell. The multilayer coating forms an infrared filter for transmitting convertible infrared energy to the cell and for reflecting as much of non-convertible infrared energy back to the IR source as possible. A TPV generator may be provided with the TPV cells.

22 Claims, 2 Drawing Sheets

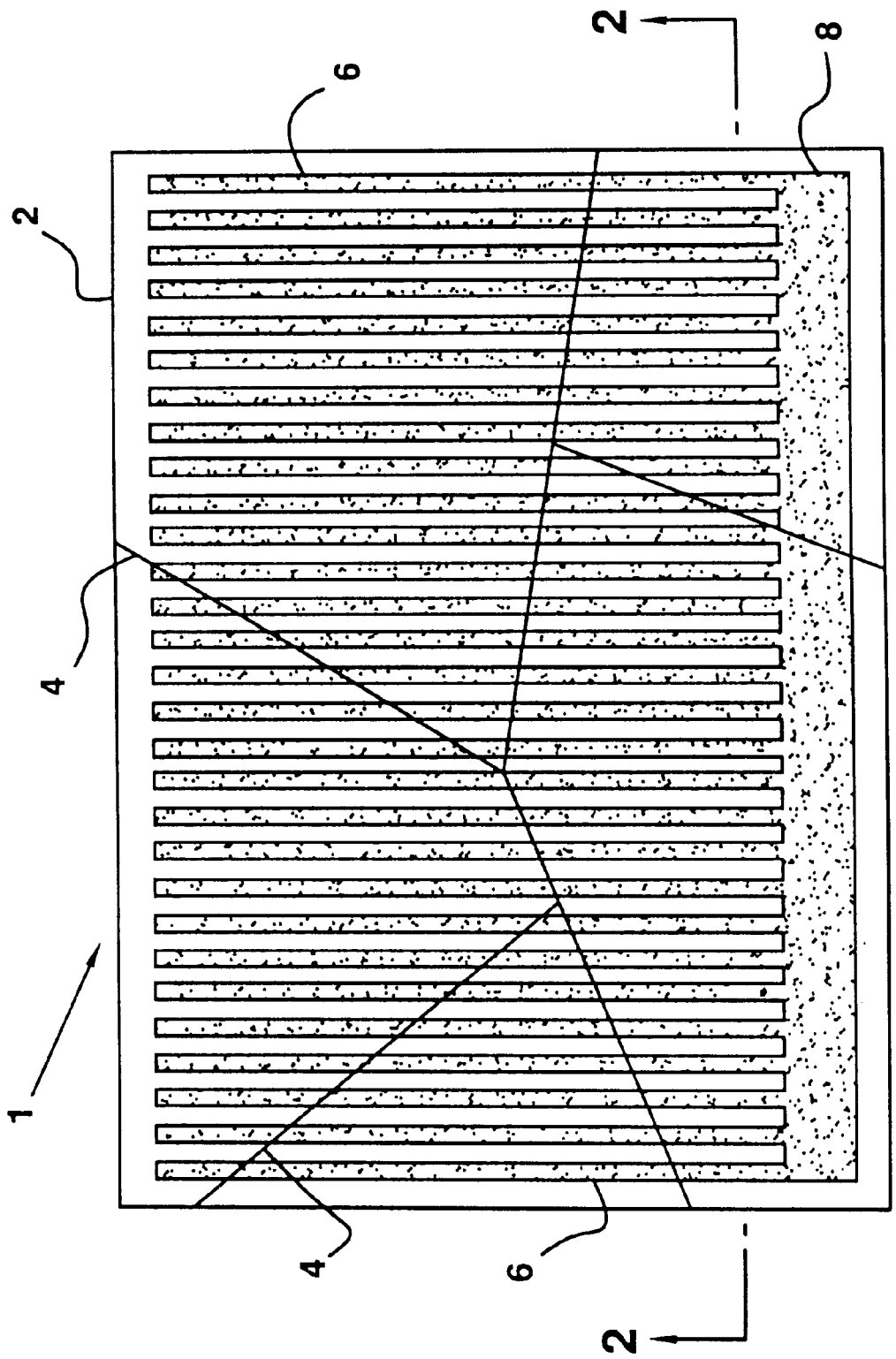

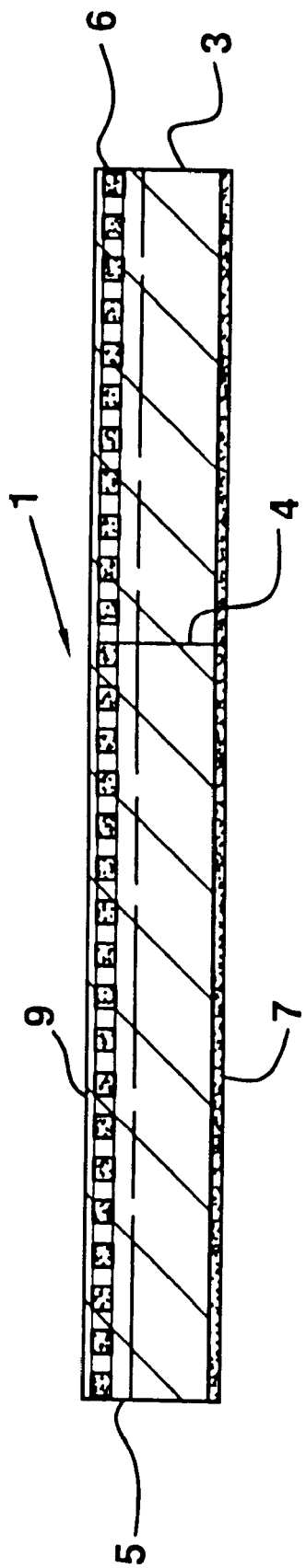

COARSE GRAIN POLYCRYSTALLINE GALLIUM ANTIMONIDE THERMOPHOTOVOLTAIC CELL

This application claims the benefit of U.S. Provisional Application Ser. No. 60/099,679 filed Sep. 10, 1998.

BACKGROUND OF THE INVENTION

Gallium antimonide (GaSb) thermophotovoltaic (TPV) cells have been fabricated for electric power generation using infrared radiation from hydrocarbon fired radiant heat sources. The market for these cells may be expanded dramatically if the cell fabrication cost is reduced. Currently, sixteen (16) GaSb cells are fabricated laid out on three (3) inch diameter single crystal GaSb wafers. The GaSb wafers are obtained by growing three (3) inch diameter GaSb single crystals. There are two primary contributors to cost. The first factor is the cost of the single-crystal wafer itself. The second factor is the cost of the wafer processing steps to obtain the final cells.

In the semiconductor industry, it is known that the device cost may be reduced by increasing the wafer diameter. That is because wafer processing costs are generally per wafer costs rather than per device costs. It is very desirable to increase the diameter of a GaSb wafer in order to reduce GaSb cell costs. For example, one might obtain 64 cells from a six (6) inch wafer at nearly the same cost that one obtains sixteen (16) cells on a three (3) inch wafer now. However, the largest diameter GaSb crystal grown to date is a four (4) inch diameter crystal. The growth of a larger crystal requires both new expensive equipment and considerable experimentation. It is desirable to obtain a large diameter low cost GaSb wafer that may be processed into high performance GaSb TPV cells.

In the solar photovoltaic field, it is known that silicon photovoltaic cells may be fabricated on coarse grain polycrystalline wafers. Although there is some degradation in performance, the polycrystalline silicon solar cells are commercially available. The polycrystalline silicon wafers are obtained from cast polycrystalline silicon ingots.

Fabricating high performance GaSb TPV cells using polycrystalline GaSb wafers is not readily apparent. First, GaSb is a different material than silicon with a different crystal structure. Second, there is no theory describing how grain boundaries effect photovoltaic cell performance. Lastly, a TPV cell is not a solar cell.

Within the TPV field, there is no empirical information relating to polycrystalline material. Starting from the solar cell case, theoretical arguments may be made both for and against polycrystalline materials. The argument against polycrystalline material is that TPV cell materials have lower band-gaps than solar cell materials (0.7 V instead of 1.1 V) and therefore, TPV materials generate lower voltages. So, any loss in cell voltage for TPV cells from grain boundary shunts is more significant and intolerable. The argument in favor of polycrystalline material is that TPV cells operate at much higher current densities and, therefore, shunting currents from grain boundaries are less significant. A need exists to fabricate high performance GaSb TPV cells using polycrystalline GaSb wafers.

SUMMARY OF THE INVENTION

JX Crystals is the only company in the world that has GaSb ingot formation and GaSb TPV cell processing capabilities in the same facility. Therefore, we were in a good position to explore the effects of polycrystalline wafers on GaSb cell performance. Several polycrystalline GaSb wafers were processed and several polycrystalline GaSb cells were fabricated. The size of the fabricated GaSb cell was 1.7 cm$^2$ and the average crystal size on the processed wafers was between 1.0 to 0.5 cm$^2$.

The results show that high performance polycrystalline GaSb TPV cells are manufacturable. Under the conditions stated, the polycrystalline cell average performance is down from the single crystal case by 8.7%. However, the potential cost savings are expected to dramatically outweigh this small performance drop.

The cell is fabricated on several GaSb crystals of varying orientations joined together at grain boundaries. A cell contains a base region of Tellurium doped N-type GaSb with a thin Zinc doped P-type surface region on its top side, which faces the infrared source. A metal grid connected to a bus region is located in contact with the P-type region on the top of the cell and a continuous metal layer is in contact with the N-type region at the back of the cell. A multilayer coating covers the front side of the cell. The multilayer coating serves as an infrared filter. Its purpose is to transmit convertible infrared energy to the cell and to reflect as much non-convertible infrared energy back to the IR source as possible.

These and further and other objects and features of the invention are apparent in the disclosure, which includes the above and ongoing written specification, with the drawings.

BRIEF DESCRIPTION OF THE DRAWINGS

FIG. 1 is a top view of the polycrystalline GaSb TPV cell.

FIG. 2 is a cross-section of the cell shown in FIG. 1.

DETAILED DESCRIPTION OF THE PREFERRED EMBODIMENTS

Several polycrystalline GaSb wafers were processed and several polycrystalline GaSb cells were fabricated. The size of the fabricated GaSb cell was 1.7 cm$^2$ and the average crystal size on the processed wafers was between 1.0 to 0.5 cm$^2$. Table 1 summarizes the results. The table compares the average performance parameters for twelve (12) single crystal control cells to twelve (12) polycrystalline cells.

TABLE 1

Poly vs Single GaSb Cell Performance Summary

|  | FF | Voc | Isc | Vmax | Pmax |
|---|---|---|---|---|---|
| Single | 0.756 | 0.463 | 6.2 | 0.387 | 2.166 |
| Poly | 0.726 | 0.438 | 6.2 | 0.363 | 1.985 |

The results show that high performance polycrystalline GaSb TPV cells are manufacturable. Under the conditions stated, the polycrystalline cell average performance is down from the single crystal case by 8.7%. However, the potential cost savings are expected to dramatically outweigh this small performance drop.

FIG. 1 shows a top view of the polycrystalline GaSb TPV cell of the present invention. FIG. 2 shows a cross section through this cell. The cell 1 is fabricated on several GaSb crystals 2 of varying orientations joined together at grain boundaries 4. A cell 1 contains a base region of Tellurium doped N-type GaSb 3 with a thin Zinc doped P-type surface region 5 on its top side, which faces the infrared source. A metal grid 6 connected to a bus region 8 is located in contact with the P-type region 5 on the top of the cell 1. A continuous metal layer 7 is in contact with the N-type region 3 at the back of the cell 1. A multilayer coating 9 covers the front side of the cell 1. The multilayer coating 9 serves as an infrared filter. Its purpose is to transmit convertible infrared energy to the cell 1 and to reflect as much non-convertible infrared energy back to the IR source as possible.

While the invention has been described with reference to specific embodiments, modifications and variations of the invention may be constructed without departing from the scope of the invention.

We claim:

1. A TPV cell apparatus comprising plural regions wherein at least one region comprises plural GaSb crystals.

2. The apparatus of claim 1, wherein the GaSb crystals are joined at grain boundaries.

3. The apparatus of claim 1, wherein the GaSb crystals are of varying orientations.

4. The apparatus of claim 1, wherein the plural regions include a surface region on the at least one region of GaSb crystals.

5. The apparatus of claim 4, wherein the surface region comprises thin Zinc doped P-type GaSb.

6. The apparatus of claim 5, further comprising an infrared source and wherein the surface region faces the infrared source.

7. The apparatus of claim 6, wherein the multilayer coating forms an infrared filter for transmitting convertible infrared energy to the cell and for reflecting non-convertible infrared energy back to the IR source.

8. The apparatus of claim 1, wherein the at least one region is a base region.

9. The apparatus of claim 1, wherein the GaSb crystals comprise Tellurium doped N-type GaSb.

10. The apparatus of claim 1, further comprising a bus region and a metal grid connected to the bus region, wherein the metal grid is in contact with the surface region of the cell.

11. The apparatus of claim 1, further comprising a continuous metal layer in contact with the at least one region of GaSb crystals.

12. The apparatus of claim 1, further comprising a multilayer coating on a front side of the cell.

13. The apparatus of claim 1, further comprising a generator for receiving the TPV cell.

14. A TPV cell apparatus comprising a base region of plural GaSb crystals of varying orientations joined at grain boundaries and a surface region on the base region.

15. The apparatus of claim 14, wherein the GaSb crystals comprise Tellurium doped N-type GaSb.

16. The apparatus of claim 15, further comprising a multilayer coating on a front side of the cell.

17. The apparatus of claim 16, wherein the multilayer coating forms an infrared filter for transmitting convertible infrared energy to the cell and for reflecting non-convertible infrared energy back to the IR source.

18. The apparatus of claim 14, wherein the surface region comprises thin Zinc doped P-type GaSb.

19. The apparatus of claim 14, further comprising an infrared source and wherein the surface region faces the infrared source.

20. The apparatus of claim 14, further comprising a bus region and a metal grid connected to the bus region, wherein the metal grid is in contact with the surface region of the cell.

21. The apparatus of claim 14, further comprising a continuous metal layer in contact with the base region.

22. A generator comprising the TPV cell of claim 14.

* * * * *